US006542082B1

(12) United States Patent
Nowka et al.

(10) Patent No.: US 6,542,082 B1
(45) Date of Patent: Apr. 1, 2003

(54) REMOTE AND NON-VISUAL DETECTION OF ILLUMINATION DEVICE OPERATION

(75) Inventors: Dennis R. Nowka, Thornton, CO (US); Gene M. Uba, Broomfield, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/314,313

(22) Filed: May 19, 1999

(51) Int. Cl.[7] .............................................. G08B 21/00
(52) U.S. Cl. ...................... 340/635; 340/638; 340/664
(58) Field of Search ................................ 340/635, 638, 340/641, 642, 458, 661, 459, 664, 657; 315/151, 129, 82, 292, 185 R, 307

(56) References Cited

U.S. PATENT DOCUMENTS

| | | | | |
|---|---|---|---|---|
| 5,397,963 A | * | 3/1995 | Manson ...................... 315/129 |
| 5,438,237 A | * | 8/1995 | Mullins et al. ................ 315/82 |
| 5,471,201 A | * | 11/1995 | Cerami et al. .............. 340/641 |
| 5,801,623 A | * | 9/1998 | Chen et al. ................. 340/458 |
| 5,912,568 A | * | 6/1999 | Kiley ......................... 327/108 |

* cited by examiner

Primary Examiner—Van Trieu
(74) Attorney, Agent, or Firm—Patton Boggs LLP

(57) ABSTRACT

The system for remote and non-visual detection of illumination device operation which is operational to identify the operational state of individual illumination devices. This is accomplished by placing the unit under test in a steady state operating condition during the burn-in and/or environmental stress testing process. The illumination devices are individually selected and operated during the test and the operational state of the selected illumination device determined. The determination of the operational state of the illumination device is effected by measuring the incremental change in power drawn by the unit under test resulting from the activation of the selected illumination device. An anomaly in the measured change in power consumption is indicative of a failure mode for the selected illumination device. Where the unit under test contains a plurality of illumination devices, the illumination devices can be checked seriatim and the type of illumination device can also be determined by the power consumption of the activated illumination device to thereby identify misinstallation of illumination devices.

14 Claims, 2 Drawing Sheets

REMOTE AND NON-VISUAL DETECTION OF ILLUMINATION DEVICE OPERATION

FIELD OF THE INVENTION

This invention relates to the automated testing of illumination devices without the need for human operators, such as the testing of the plurality of illumination devices that are present in a telephone station set when the telephone station set is undergoing burn-in and/or environmental stress testing.

PROBLEM

It is a problem in the field of automated testing of units under test to perform the necessary tests when the unit under test is undergoing burn-in and/or environmental stress testing. For example, a typical unit under test, such as a telephone station set is equipped with a plurality of illumination devices, such as red and green light emitting diodes, which must be tested to ensure their proper operation during the manufacturing process. The basic operation of these illumination devices can be determined by human operator inspection of the telephone station set during the routine unit test process. However, when the telephone station set is subjected to burn-in and/or environmental stress testing, the human operator is unable to access the telephone station set to determine the operational state of the illumination devices that are contained in the telephone station set. It is impractical to attempt to add apparatus to measure the light output of the illumination devices during the test process due to the difficulty of maintaining such test apparatus in alignment with the illumination devices during the test process. It is also costly to provide and interconnect such apparatus to the unit under test due to the hostile nature of the test environment. Therefore, dynamic testing of illumination devices during burn-in and/or environmental stress testing is presently not done.

However, it is desirable to identify not only the failure of an illumination device but also the conditions surrounding its failure. Collecting failure data relating to the reliability and failure modes of the illumination devices enable the manufacturer to increase the reliability of the telephone station set by identifying conditions which increase the probability of failure of the illumination devices. The inability of a manufacturer to identify the weaknesses in the unit under test results in increased number of failures.

There is presently no test apparatus that enables the manufacturer of a unit under test which contains illumination devices to determine the operational state of the illumination devices when the unit under test is undergoing burn-in and/or environmental stress testing. The automation of such tests and the ability to determine the operational state of illumination devices non-visually therefore represents a presently unmet need in the industry.

SOLUTION

The above-described problems are solved and a technical advance achieved in the field by the present system for remote and non-visual detection of illumination device operation which is operational to identify the operational state of individual illumination devices. This is accomplished by placing the unit under test in a steady state operating condition during the burn-in and/or environmental stress testing process. The illumination devices are then individually selected and operated during the test and the operational state of the selected illumination device determined. The determination of the operational state of the illumination device is effected by measuring the incremental change in power drawn by the unit under test resulting from the activation of the selected illumination device. An anomaly in the measured change in power consumption is indicative of a failure mode for the selected illumination device. Where the unit under test contains a plurality of illumination devices, the illumination devices can be checked seriatim and the type of illumination device can also be determined by the power consumption of the activated illumination device to thereby identify misinstallation of illumination devices.

DETAILED DESCRIPTION

Figure 1:
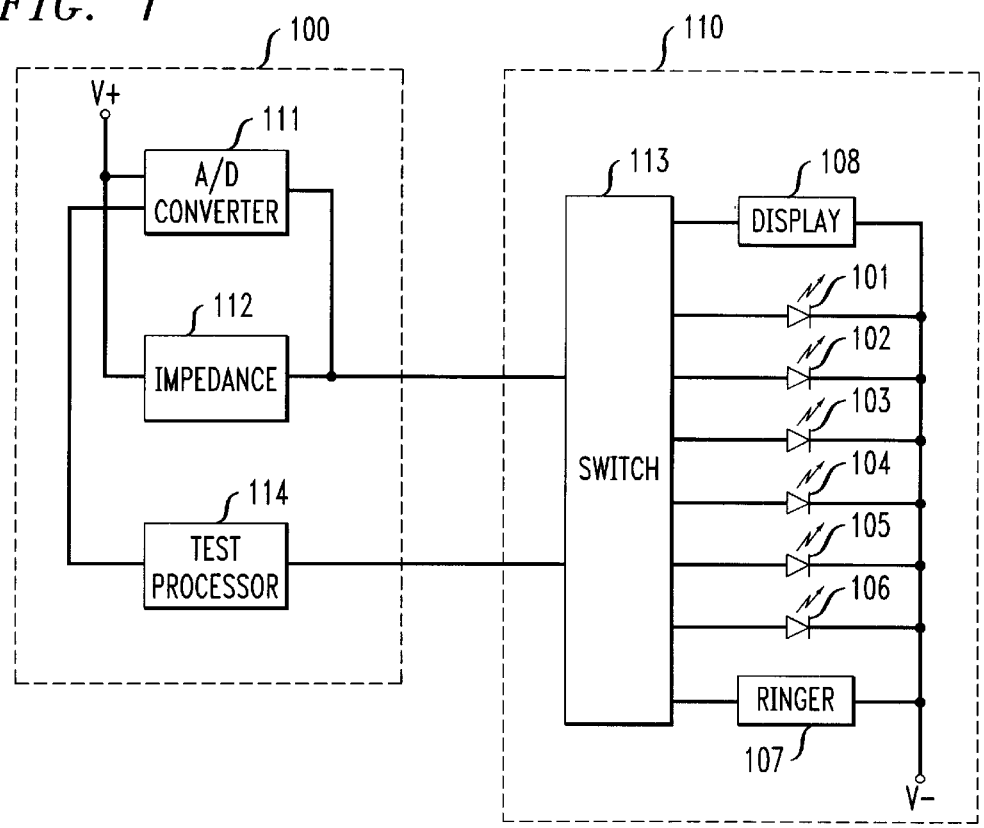
FIG. 1 illustrates in block diagram form the overall architecture of the present system for remote and non-visual detection of illumination device operation as connected to a typical unit under test.
Figure 2:
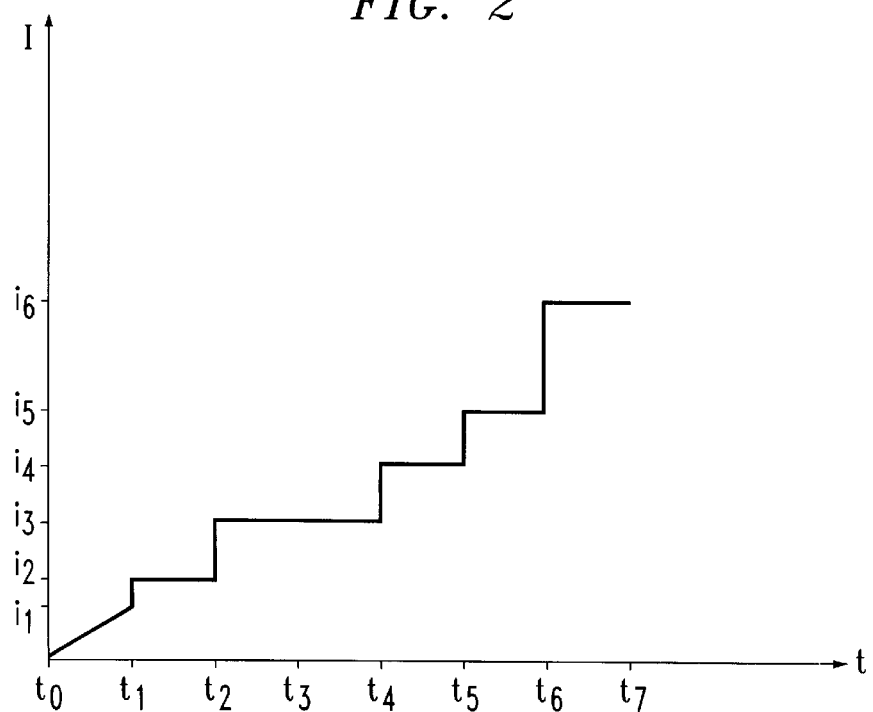
FIG. 2 illustrates a waveform diagram to illustrate the measured power consumption of the unit under test shown in FIG. 1 as the various illumination devices contained therein are activated seriatim.
Figure 3:
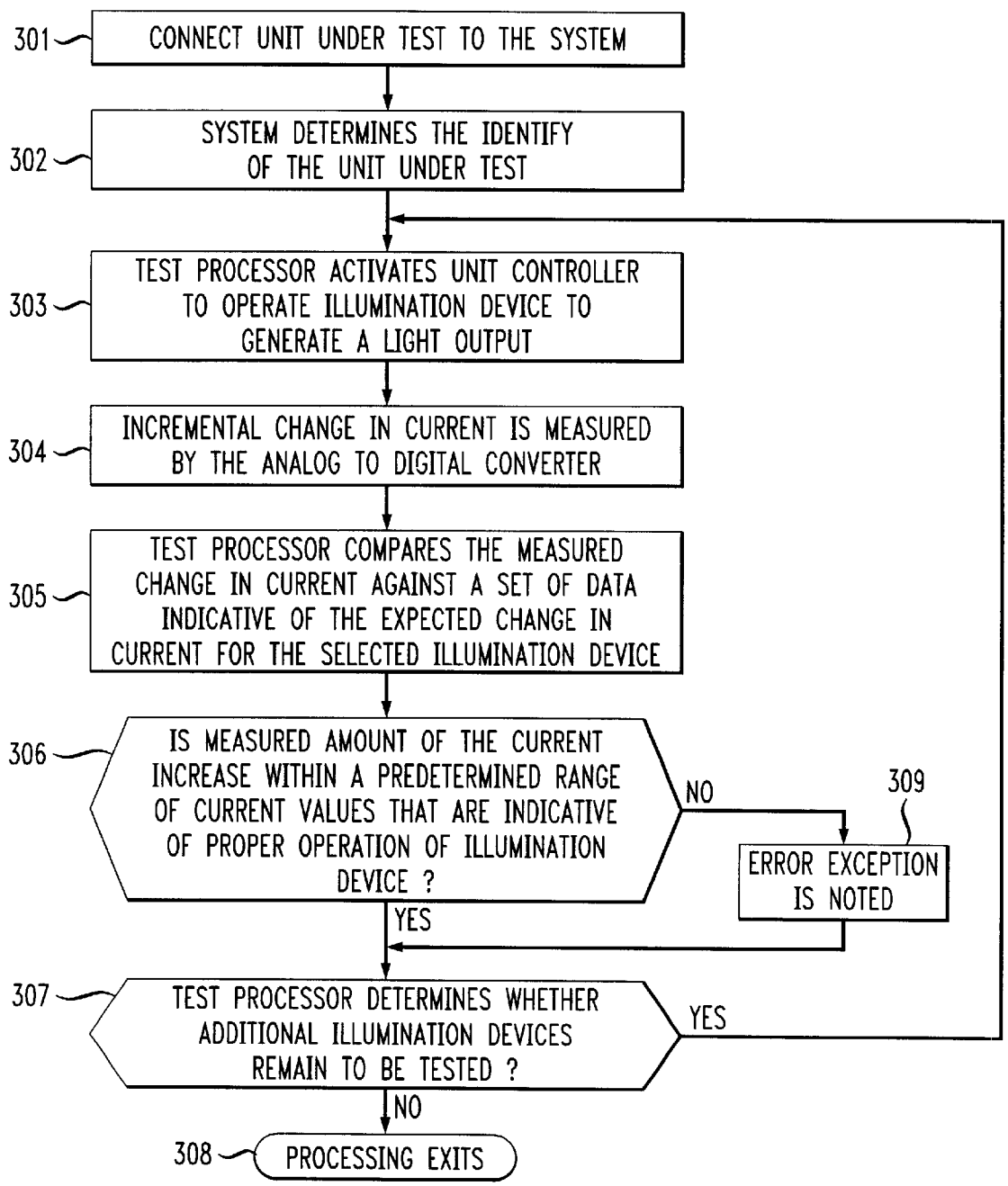
FIG. 3 illustrates in flow diagram form the operational steps taken by the present system for remote and non-visual detection of illumination device operation in testing a typical unit under test.

FIG. 1 illustrates in block diagram form the overall architecture of the present system for remote and non-visual detection of illumination device operation 100 as connected to a typical unit under test 110 and FIG. 2 illustrates a waveform diagram to illustrate the measured power consumption of the unit under test shown in FIG. 1 as the various illumination devices contained therein are activated seriatim. For the purposes of illustration, the unit under test 110 is selected to be a telephone station set that is equipped with a ringer 107, display device 108 for displaying textual data, as well as a plurality of illumination devices, such as light emitting diodes 101–106. The system for remote and non-visual detection of illumination device operation 100 exercises and tests telephone station sets which can realize any of a number of well-known protocol schemes, such as: ATLJETR, DCP 2 and 4 wire, ISDN/NT2 4 wire. The illumination devices can be uniform in nature or can by of various different types. In the telephone station set, some of the plurality of illumination devices 101–106 can be red light output light emitting diodes 101, 103, 105, while others of the plurality of illumination devices 101–106 can be green light outputting light emitting diodes 102, 104, 106. It is typical for the power consumption $I_G$ of the green light emitting diodes 102, 104, 106 to differ from the power consumption $I_R$ of the red light emitting diodes 101, 103, 105. The power consumption of a light emitting diode is typically limited to a narrow range of values centered around a nominal current draw.

The present system for remote and non-visual detection of illumination device operation 100 is operational to identify the operational state of individual illumination devices. This is accomplished by connecting the unit under test 110 to the system for remote and non-visual detection of illumination device operation 100 at step 301, typically using the existing cabling from the unit under test 110. The system for remote and non-visual detection of illumination device operation 100 at step 302 determines the identity of the unit under test, either automatically or as identified by an operator, and places the unit under test 110 in a steady state operating condition at time $t_0$ during the burn-in and/or environmental stress testing process, wherein the unit under test 110 draws a steady state current of magnitude $i_1$. The system for remote and non-visual detection of illumination device operation 100 contains an impedance device 112 (such as a low impedance resistor) connected in series in the power supply conductor, such that the current drawn by the unit under test 110 (or at least the illumination devices 101–106 passes through the impedance device 112. An analog to digital converter 111 is connected across the impedance device 112 to measure the voltage drop across the impedance device 112, which voltage drop is indicative of the current passing through impedance device 112. A test processor 114 is provided in the system for remote and non-visual detection of illumination device operation 100 to store data values indicative of at least one test process and the expected current draws for the plurality of illumination devices contained in the unit under test, execute the test process, determine the operational states of the illumination devices 101–106 contained in the unit under test 110 and output the test results to an operator. The unit under test 110 typically contains some unit controller element 113 to enable the individually selection and operation of the illumination devices 101–106. The test processor 114 is connected to the unit controller 113 to thereby control the operation of the unit under test 110.

The unit under test 110 is subjected to the typical environmental stress conditions produced by a test chamber (not shown) into which it is placed. It is desirable during the test to determine the operational state of selected illumination devices 101–106. The determination of the operational state of an illumination device is effected by measuring the incremental change in power drawn by the unit under test 110 resulting from the activation of the selected illumination device. An anomaly in the measured change in power consumption is indicative of a failure mode for the selected illumination device. Where the unit under test 110 contains a plurality of illumination devices 101–106, the illumination devices 101–106 can be checked seriatim and the type of illumination device can also be determined by the power consumption of the activated illumination device to thereby identify misinstallation of illumination devices.

Therefore, as noted above at step 302 (time $t_0$), the system for remote and non-visual detection of illumination device operation 100 powers up the unit under test 110 to a steady state quiescent power level, as shown in FIG. 2, where a steady state current $i_1$ is drawn by the unit under test 110. The test processor 114 of the system for remote and non-visual detection of illumination device operation 100 at step 303 activates unit controller 113 to operate a first illumination device 101 to generate a light output. It is assumed that the first illumination device 101 is a red light emitting diode 101, which has a power consumption of $I_R$ when illumination device 101 is on in a steady state mode. Thus, the activation of red illumination device 101 at step 303 causes the current drawn by unit under test 110 to increase from the quiescent current of $i_1$ to a current level of $i_2=i_1+i_R$. This incremental change in current is measured at step 304 by the analog to digital converter 111 and converted to a digital signal which is communicated to the test processor 114. The test processor 114 at step 305 compares the measured change in current against a set of data indicative of the expected change in current for the selected illumination devices in the designated type of unit under test. If the measured amount of the current increase $i_R$ is within a predetermined range of current values that are indicative of proper operation of a red light emitting diode, the test processor 114 can therefore certify the operational status of the light emitting diode 101 at step 306. Once this test procedure is completed, test processor 114 at step 307 determines whether additional illumination devices remain to be tested by this procedure. If not, processing exits at step 308 and the test results are output to a test results output device, such as a display unit. If at step 307 it is determined that additional illumination devices are to be tested, processing returns to step 303. Thus, at time $t_2$ the test processor 114 activates unit controller 113 to operate a second illumination device 102 to generate a light output. It is assumed that the second illumination device 102 is a green light emitting diode 102, which has a power consumption of $I_G$ when illumination device 102 is on in a steady state mode. Thus, the activation of red illumination device 102 causes the current drawn by unit under test 110 to increase from the quiescent current of $i_2$ to a current level of $i_3=i_2+i_G$. This incremental change in current is measured by the analog to digital converter 111 and converted to a digital signal which is communicated to the test processor 114. The amount of the current increase $i_G$ is indicative of proper operation of a red light emitting diode and the test processor can therefore certify the operational status of the light emitting diode 102. This process of testing the light emitting diodes 101–106 can proceed seriatim through steps 303–307 until all of the light emitting diodes 101–106 are tested.

The failure of a light emitting diode to operate can be detected as shown at time $t_3$ where the test processor activates unit controller 113 to operate a third illumination device 103 to generate a light output. It is assumed that the third illumination device 103 is a red light emitting diode 103, which has a power consumption of $I_R$ when illumination device 103 is on in a steady state mode. As shown in the waveform diagram of FIG. 2, the current drawn by the unit under test 110 does not change in response to the unit controller 113 activating the third light emitting diode 103. Therefore, this failure of the current draw to increase is indicative of a failed light emitting diode 103. The occurrence of a failure in the unit under test 110 can be processed in a number of ways by test processor 114. The determination of a failure at step 305 causes processing to branch to step 309 where an error exception is noted. This step can comprises the simple recording of the error in a memory or the interruption of the test process for the immediate repair of the unit under test by a human operator. In any case, the error condition is processed as desired and the processing then returns to step 307 as described above. The misinstallation of a light emitting diode can also be detected as shown at time $t_5$ where the next successive illumination device is light emitting diode 105 which should be a red light emitting diode 105, which has a power consumption of $I_R$ when illumination device 105 is on in a steady state mode. As shown in the waveform diagram of FIG. 2, the current drawn by the unit under test 110 in response to the unit controller 113 activating light emitting diode 105 is $I_5=I_4+I_G$ which is indicative of the presence of a green light emitting diode. Therefore, test processor 114 determines that either the red light emitting diode installed at this location is operating in a faulty mode, or that a green light emitting diode has inadvertently been installed at this location. Finally, a defectively operating light emitting diode can also be detected as shown at time $t_6$ where the next successive illumination device is light emitting diode 106 should be a green light emitting diode 106, which has a power consumption of $I_G$ when illumination device 106 is on in a steady state mode.

As shown in the waveform diagram of FIG. 2, the current drawn by the unit under test 110 in response to the unit controller 113 activating light emitting diode 106 is $I_6=I_5+I_D$, where $I_D>I_G$ which is indicative of the presence of a defective green light emitting diode. Therefore, test processor 114 determines that the green light emitting diode installed at this location is operating in a faulty mode.

Thus, the system for remote and non-visual detection of illumination device operation can automatically determine the operational state of illumination devices that are located in a unit under test. Not only can the operational state be determined, but the type of illumination device installed in the unit under test can in many cases by accurately identified. The system for remote and non-visual detection of illumination device operation can perform tests on the illumination devices without requiring the intervention of a human operator.

SUMMARY

The system for remote and non-visual detection of illumination device operation determines the operational state of illumination devices contained within a unit under test, when the unit under test is undergoing burn-in and/or environmental stress testing, by measuring the incremental change in power drawn by the unit under test resulting from the activation of the selected illumination device. An anomaly in the measured change in power consumption is indicative of a failure mode for the selected illumination device. While the successive and cumulative operation of the plurality of illumination devices is described above, the individual illumination devices can be sequentially cycled between off and on states to measure the effect of a single illumination device on the quiescent current of the unit under test.

What is claimed:

1. A test apparatus for automatically identifying the operational integrity of selected ones of a plurality of illumination devices contained in a remotely located unit under test, which illumination devices are each operational to generate an optical output, wherein each said illumination device has a predetermined current draw when operational and outputting light, said test apparatus comprising:

means for supplying current to said unit under test, which includes all of said plurality of illumination devices;

means for transmitting control signals to said unit under test to activate a selected one of said plurality of illumination devices contained in said unit under test to change the operational state of said selected one of said plurality of illumination devices; and means for measuring a change in said current drawn by said unit under test in response to said selective activation of said selected one of said plurality of illumination devices.

2. The test apparatus for identifying the activation of an illumination device of claim 1 wherein said means for measuring comprises:

means, connected in series in a conductor that supplies power to said unit under test, for reflecting a current drawn by said unit under test as a voltage drop; and means for converting said voltage drop to a digital signal indicative of a magnitude of said voltage drop.

3. The test apparatus for identifying the activation of an illumination device of claim 2 wherein said means for measuring further comprises:

means for comparing said digital signal to a data value stored in a memory which data value is indicative of an expected voltage drop for said selected one of said plurality of illumination devices.

4. The test apparatus for identifying the activation of an illumination device of claim 3 wherein said means for measuring further comprises:

means, responsive to said digital signal differing from said data value by greater than a predetermined amount, for generating an error indication.

5. The test apparatus for identifying the activation of an illumination device of claim 4 wherein said means for measuring further comprises:

means, responsive to said error indication, for identifying a nature of failure of said illumination device.

6. The test apparatus for identifying the activation of an illumination device of claim 3 wherein said means for measuring further comprises:

means, responsive to said digital signal differing from said data value by less than a predetermined amount, for generating an indication of proper illumination device operation.

7. A method of operating a test apparatus for automatically identifying the operational integrity of selected ones of a plurality of illumination devices contained in a remotely located unit under test, which illumination devices are each operational to generate an optical output, wherein each said illumination device has a predetermined current draw when operational and outputting light, comprising the steps of:

supplying current to said unit under test, which includes all of said plurality of illumination devices:

transmitting control signals to said unit under test to activate a selected one of said plurality of illumination devices contained in said unit under test to change the operational state of said selected one of said plurality of illumination devices; and measuring a change in said current drawn by said unit under test in response to said selective activation of said selected one of said plurality of illumination devices.

8. The method of operating a test apparatus for identifying the activation of an illumination device of claim 7 wherein said step of measuring comprises:

operating a device connected in series in a conductor that supplies power to said unit under test, to reflect a current drawn by said unit under test as a voltage drop; and converting said voltage drop to a digital signal indicative of a magnitude of said voltage drop.

9. The method of operating a test apparatus for identifying the activation of an illumination device of claim 8 wherein said step of measuring further comprises:

comparing said digital signal to a data value stored in a memory which data value is indicative of an expected voltage drop for said selected one of said plurality of illumination devices.

10. The method of operating a test apparatus for identifying the activation of an illumination device of claim 9 wherein said step of measuring further comprises:

generating, in response to said digital signal differing from said data value by greater than a predetermined amount, an error indication.

11. The method of operating a test apparatus for identifying the activation of an illumination device of claim 10 wherein said step of measuring further comprises:

identifying, in response to said error indication, a nature of failure of said illumination device.

12. The method of operating a test apparatus for identifying the activation of an illumination device of claim 9 wherein said step of measuring further comprises:

generating, in response to said digital signal differing from said data value by less than a predetermined amount, an indication of proper illumination device operation.

13. A method of testing selected ones of a plurality of illumination devices contained in a remotely located unit under test to check the optical output of selected ones of said plurality of illumination devices, comprising the steps of:

connecting said unit under test to said test apparatus;

supplying current to said unit under test, which includes all of said plurality of illumination devices:

transmitting control signals to said unit under test to selectively activate at least one of said plurality of illumination devices contained in said unit under test to change the operational state of said selected one of said plurality of illumination devices;

measuring a change in said current draw of said unit under test due to activation of said at least one of said plurality of illumination devices;

determine whether said measured change in said current draw is within a predetermined threshold;

storing data identifying the result of said determination; and generating a test result indication to reflect said determination.

14. The method of claim 13, further comprising the step of:

repeating said steps of selectively activating through storing for a predetermined number of illumination devices.

* * * * *